United States Patent
Lu

(10) Patent No.: US 8,930,174 B2
(45) Date of Patent: Jan. 6, 2015

(54) MODELING TECHNIQUE FOR RESISTIVE RANDOM ACCESS MEMORY (RRAM) CELLS

(75) Inventor: Wei Lu, Ann Arbor, MI (US)

(73) Assignee: Crossbar, Inc., Santa Clara, CA (US)

( * ) Notice: Subject to any disclaimer, the term of this patent is extended or adjusted under 35 U.S.C. 154(b) by 533 days.

(21) Appl. No.: 13/077,941

(22) Filed: Mar. 31, 2011

(65) Prior Publication Data

US 2012/0166169 A1 Jun. 28, 2012

Related U.S. Application Data

(60) Provisional application No. 61/427,741, filed on Dec. 28, 2010.

(51) Int. Cl.
G06F 17/50 (2006.01)
G06G 7/62 (2006.01)
G11C 13/00 (2006.01)

(52) U.S. Cl.
CPC ........ G06F 17/5036 (2013.01); G11C 13/0009 (2013.01); G06F 17/5022 (2013.01); G06F 17/5027 (2013.01)
USPC .............................................. 703/14; 703/13

(58) Field of Classification Search
CPC ............ G06F 17/5036; G06F 17/5022; G06F 17/5027; G11C 13/0009
USPC .................................................... 703/13–14
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |

(Continued)

FOREIGN PATENT DOCUMENTS

| | | |
|---|---|---|
| JP | 2005-506703 A | 3/2005 |
| JP | 2006-032951 A | 2/2006 |

(Continued)

OTHER PUBLICATIONS

Russo, Ugo, et al. "Self-accelerated thermal dissolution model for reset programming in unipolar resistive-switching memory (RRAM) devices." Electron Devices, IEEE Transactions on 56.2 (2009): 193-200.*

(Continued)

*Primary Examiner* — Aniss Chad
(74) *Attorney, Agent, or Firm* — Ogawa P.C.

(57) ABSTRACT

Accurate simulation of two-terminal resistive random access memory (RRAM) behavior is accomplished by solving equations including state variables for filament length growth, filament width growth, and temperature. Such simulations are often run in a SPICE environment. Highly accurate models simulate the dynamic nature of filament propagation and multiple resistive states by using a sub-circuit to represent an RRAM cell. In the sub-circuit, voltages on floating nodes control current output while the voltage dropped across the sub-circuit controls growth and temperature characteristics. Properly executed, such a sub-circuit can accurately model filament growth at all phases of conductance including dynamic switching and a plurality of resistive states.

14 Claims, 10 Drawing Sheets

(56) References Cited

U.S. PATENT DOCUMENTS

| | | |
|---|---|---|
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 * | 7/2004 | Mills, Jr. .................. 257/469 |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 * | 1/2008 | Kerns et al. .................. 365/63 |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,606,059 B2 | 10/2009 | Toda |
| 7,615,439 B1 | 11/2009 | Schricker et al. |
| 7,629,198 B2 | 12/2009 | Kumar et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl |
| 8,265,136 B2 | 9/2012 | Hong et al. |
| 8,374,018 B2 | 2/2013 | Lu |
| 8,385,100 B2 | 2/2013 | Kau et al. |
| 8,394,670 B2 | 3/2013 | Herner |
| 8,441,835 B2 | 5/2013 | Jo et al. |
| 8,467,227 B1 | 6/2013 | Jo |
| 8,587,989 B2 | 11/2013 | Manning et al. |
| 8,658,476 B1 | 2/2014 | Sun et al. |
| 8,659,003 B2 | 2/2014 | Herner et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 * | 12/2008 | Ho et al. .................. 365/148 |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |

(56) References Cited

U.S. PATENT DOCUMENTS

| | | |
|---|---|---|
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0317470 A1 | 12/2011 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043519 A1 | 2/2012 | Jo et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0269275 A1 | 10/2012 | Hannuksela |
| 2012/0305874 A1 | 12/2012 | Herner |
| 2013/0020548 A1 | 1/2013 | Clark et al. |

FOREIGN PATENT DOCUMENTS

| | | |
|---|---|---|
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |

OTHER PUBLICATIONS

Cagli, C., et al. "Evidence for threshold switching in the set process of NiO-based RRAM and physical modeling for set, reset, retention and disturb prediction." Electron Devices Meeting, 2008. IEDM 2008. IEEE International. IEEE, 2008.*

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. LeComber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

(56) References Cited

OTHER PUBLICATIONS

Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16,1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
*Ex parte Quayle* Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs. acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.

Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.

(56) References Cited

OTHER PUBLICATIONS

Office Action for U.S. Appl. No. 12/861,650 dated Oct 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653, dated Nov. 20, 2012.
Notice of Allowance for U.S. Appl. No. 13/290,024 dated Nov. 28, 2012.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action of U.S. Appl. No. 13/436,714 dated Dec. 7, 2012.
Office Action for U.S. Appl. No. 12/835,704, dated Mar. 14, 2014.
Office Action for U.S. Appl. No. 13/870,919, dated Apr. 3, 2013.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 14/072,657, dated Jun. 17, 2014.

* cited by examiner

MODELING TECHNIQUE FOR RESISTIVE RANDOM ACCESS MEMORY (RRAM) CELLS

CROSS-REFERENCES TO RELATED APPLICATIONS

This application claims priority from provisional U.S. Provisional Application No. 61/427,741, filed Dec. 28, 2010, entitled "Modeling Technique for Resistive Random Access Memory Cells," the entire disclosure of which, including all attachments and appendices, are incorporated by reference in their entirety for all purposes.

BACKGROUND OF THE INVENTION

The present invention relates to simulation of Resistive Random-Access Memory (RRAM) or other two-terminal resistive devices with hysteresis. Such devices are also sometimes termed memristors.

RRAM is a type of resistive memory that has generated significant interest as a potential candidate for ultra-high density non-volatile information storage. Fabrication costs of RRAM designs are substantial, so considerable savings can be realized by optimizing design by modeling RRAM in a simulated environment. As RRAM technology becomes available to circuit designers, there will be an increasing need for accurate modeling and simulation tools.

A working principle of RRAM devices is the formation of a conductive path governed by a filamentary process. In an exemplary device, in the presence of an applied electric field, silver ions migrate through an amorphous silicon solid electrolyte to form a conductive filament along which electrons can travel. As current passes through the device, Joule heating raises the device temperature, which affects filament growth. Filament growth exists in at least two different forms, including extension of length between electrodes and an increase in width, both of which have an effect on the electrical properties of an RRAM cell.

Two-terminal RRAM has several unusual properties. For example, under the application of a bias voltage, the activation energy of a silver ion varies with distance as it moves from a source electrode to a destination electrode, and the amplitude of subsequent energy peaks decreases with respect to distance as the ion passes through imperfections in a semiconductor matrix. When a two-terminal RRAM cell is coupled to a resistor in series, variance of the resistance value of the resistor can affect the final resistance of the RRAM cell, thereby allowing the cell to retain additional data.

Current simulation models typically utilize a fixed threshold voltage to activate an RRAM write cycle. Such models assume that a single set voltage will result in changing a resistance value from an ON state to an OFF state, or vice versa. However, the threshold voltage is dynamic in an actual two-terminal RRAM device. Using a fixed voltage fails to capture some of its unique properties, and otherwise results in an inaccurate simulation.

Current simulation models typically utilize a fixed switching time to activate an RRAM write cycle. However, the switching time is dynamic in an actual two-terminal RRAM device and varies with respect to voltage. Using a fixed switching time fails to capture some of its unique properties, and otherwise results in an inaccurate simulation.

There is a need for an accurate simulation model that accurately models the dynamic characteristics of a two-terminal RRAM cell. Although equations have been established to represent some aspects of memory cell performance, existing simulation models are not capable of simultaneously accounting for the variables of ion growth and current in the greater context of a circuit. An RRAM simulation method and system capable of resolving the dynamic relationship between state variables and properties in an RRAM cell would aid the task of incorporating these important new technologies into circuit designs, and help bring the use of RRAM devices closer to realization.

BRIEF SUMMARY OF THE INVENTION

The present invention relates to simulation of RRAM behavior.

In an embodiment, a computer-implemented method for modeling a circuit includes a resistive random access memory (RRAM) cell. The method includes providing a circuit including at least one RRAM cell in a display area of a computer system, the RRAM cell being associated with a first internal state variable; calling a sub-circuit module that represents the RRAM cell and has a first component that corresponds to a formula for solving the first internal state variable; modeling a characteristic of the circuit using the sub-circuit module; adjusting the circuit using a result of the modeling step; and storing the adjusted circuit in a storage location associated with the computer system.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

The present invention relates to simulation of Resistive Random-Access Memory (RRAM).

The embodiments presented herein are described in context with amorphous silicon based RRAM cells. However, the invention is not limited to these embodiments, but can be practiced with other types of RRAM devices, including RRAMs based on metal oxide, chalcogenide based and organic materials.

The 'Simulation Program with Integrated Circuit Emphasis' (SPICE) is one of the most widely used simulation engines for device modeling and provides and extensible framework for the addition of new components. Although RRAM modeling techniques and certain embodiments are described herein in connection with SPICE, the framework and the modeling techniques may be used with circuit simulation software programs other than SPICE.

Figure 1:
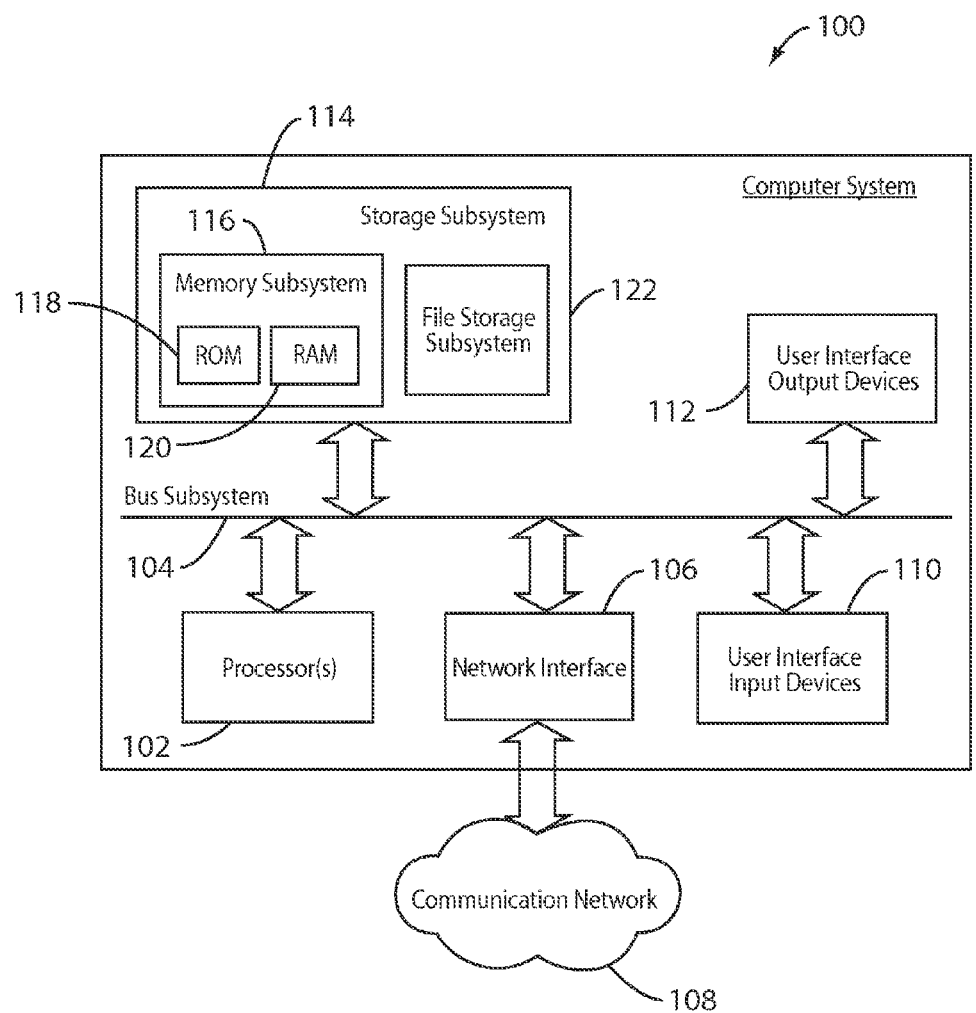
FIG. 1 illustrates a computer system according to an embodiment of the present invention.

FIG. 1 illustrates a simplified block diagram of an exemplary computer system 100 according to an embodiment of the present invention. Computer system 100 typically includes at least one processor 102, which communicates with a number of peripheral devices via bus subsystem 104. These peripheral devices typically include a storage subsystem 114, user interface input devices 110, and a network interface subsystem 106. The input and output devices allow user interaction with computer system 100. It should be apparent that the user may be a human user, a device, a process, another computer, and the like. Network interface subsystem 106 provides an interface to outside networks.

User interface input devices 110 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 100 or onto communication network 108.

User interface output devices 112 may include a display subsystem, a printer, a fax machine, or non-visual displays such as audio output devices. The display subsystem may be a cathode ray tube (CRT), a flat-panel device such as a liquid crystal display (LCD), or a projection device. The display subsystem may also provide non-visual display such as via audio output devices. In general, use of the term "output device" is intended to include all possible types of devices and ways to output information from computer system 100 to a user or to another machine or computer system.

Storage subsystem 114 stores the basic programming and data constructs that provide the functionality of the computer system. For example, the various modules implementing the functionality of the present invention may be stored in storage subsystem 114. These software modules are generally executed by processor(s) 102. In a distributed environment, the software modules may be stored on a plurality of computer systems and executed by processors of the plurality of computer systems. Storage subsystem 114 also provides a repository for storing the various databases storing information according to the present invention. Storage subsystem 114 typically comprises memory subsystem 116 and file storage subsystem 122.

Memory subsystem 116 typically includes a number of memories including a main random access memory (RAM) 120 for storage of instructions and data during program execution and a read only memory (ROM) 118 in which fixed instructions are stored. File storage subsystem 122 provides persistent (non-volatile) storage for program and data files, and may include a hard disk drive, a floppy disk drive along with associated removable media, a Compact Digital Read Only Memory (CD-ROM) drive, an optical drive, removable media cartridges, and other like storage media. One or more of the drives may be located at remote locations on other connected computers at another site on communication network 108. Information stored according to the teachings of the present invention may also be stored by file storage subsystem 122.

Bus subsystem 104 provides a mechanism for letting the various components and subsystems of computer system 100 communicate with each other as intended. The various subsystems and components of computer system 100 need not be at the same physical location but may be distributed at various locations within a distributed network. Although bus subsystem 104 is shown schematically as a single bus, alternative embodiments of the bus subsystem may utilize multiple busses.

Computer system 100 itself can be of varying types including a personal computer, a portable computer, a workstation, a computer terminal, a network computer, a mainframe, or any other data processing system. Due to the ever-changing nature of computers and networks, the description of computer system 100 depicted in FIG. 1 is intended only as a specific example for purposes of illustrating the preferred embodiment of the computer system. Many other configurations of a computer system are possible having more or fewer components than the computer system depicted in FIG. 1. Client computer systems and server computer systems generally have the same configuration as shown in FIG. 1, with the server systems generally having more storage capacity and computing power than the client systems.

The electrical behavior of RRAM is complex, and in the case of two-terminal RRAM, may take place in multiple discrete phases during a write cycle. These include a length growth phase and a width growth phase. These phases have distinct characteristics which must be dealt with separately in order to accurately model RRAM behavior.

Figure 2A:
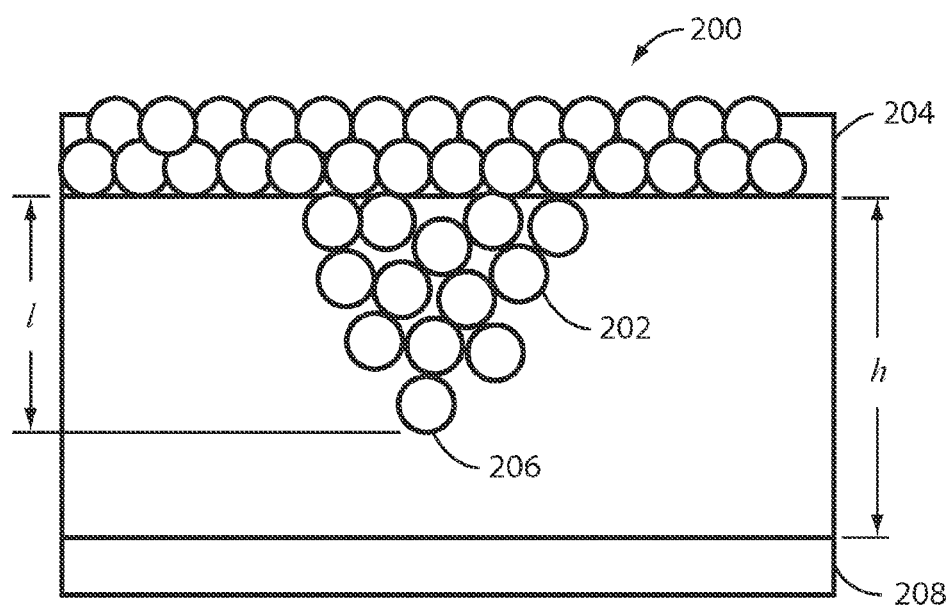
FIG. 2a illustrates a length growth phase of a two-terminal RRAM cell.

The first stage of filament growth in an RRAM cell 200 is shown in FIG. 2a. In the first stage of filament growth, the length 'l' of a filament 202, which is the distance between filament front 206 and top electrode 204, grows as ions from the top electrode 204 are oxidized and migrate along the applied electric field towards the bottom electrode 208. The distance between top electrode 204 and bottom electrode 208 is represented as 'h'. In the absence of an applied voltage, the velocity of the filament front can be derived as follows:

$$\frac{dl}{dt} = d\tau_0 \left( \exp\left(\frac{-U_a}{V_{Therm}}\right) - \exp\left(\frac{-U_a}{V_{Therm}}\right) \right) = 0$$

Where $V_{therm} = kT/q$ and
d is the hopping site distance, or distance between impurities,
$\tau_0$ is the material-dependent ion hop attempt frequency,
$U_a$ is the activation energy,
k is Boltzmann's constant in J/K,
T is the temperature in Kelvin,
q is the charge on an electron, and
l is the filament length as shown in FIG. 2a.

Figure 2B:
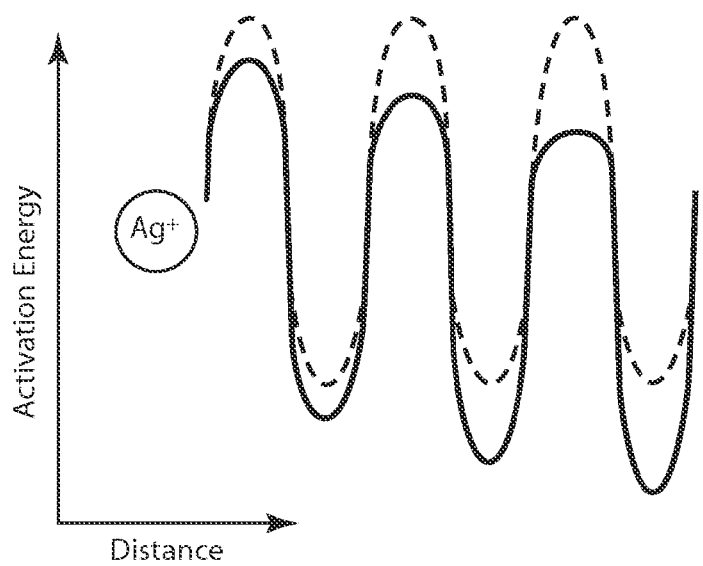
FIG. 2b illustrates the activation energy experienced by a silver ion as it moves through a silicon matrix towards an electrode in a two-terminal RRAM cell.
Figure 3:
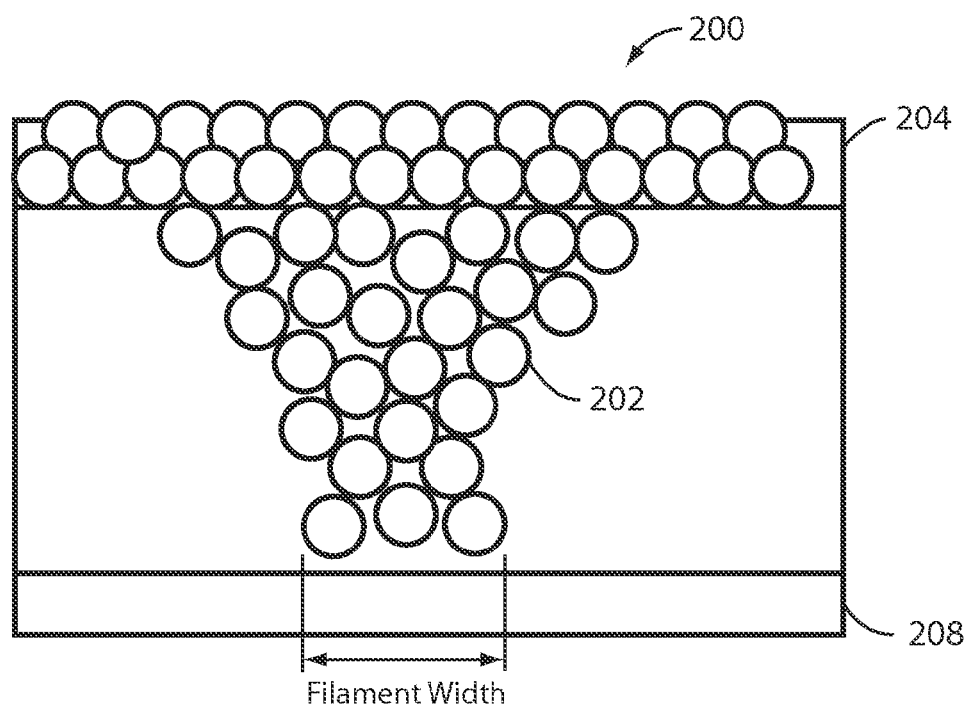
FIG. 3 illustrates a width growth phase of a two-terminal RRAM cell.

As a silver ion moves from one impurity in the silicon matrix to another under an applied voltage V, it experiences changes in the potential energy barrier. The potential energy decreases with respect to distance according to the equation V·d/2(h−l). This behavior is illustrated in FIG. 2b, in which the solid line represents the actual potential energy barrier experienced by a silver ion. The distance between peaks is the hopping site distance d, and the difference between the dotted line, which represents equilibrium behavior, and the solid line is caused by the decreasing potential energy, where applying a voltage V reduces the barrier height. Thus, Equation 1 for deriving filament length with respect to time is:

[Eq. 1]

$$\frac{dl}{dt} = d\tau_0 \left( \exp\left(\frac{-U_a + \frac{V_d}{2}}{V_{Therm}}\right) - \exp\left(\frac{-U_a - \frac{V_d}{2}}{V_{Therm}}\right) \right) \quad (1)$$

$$= d\tau_0 \exp\left(\frac{-U_a}{V_{Therm}}\right) \left( \exp\left(\frac{\frac{V_d}{2}}{V_{Therm}}\right) - \exp\left(\frac{\frac{V_d}{2}}{V_{Therm}}\right) \right)$$

where $V_d$ is the voltage dropped between each hopping site.

$$V_d = Ed = \frac{V}{h-l} d$$

where h is distance between electrodes as shown in FIG. 2. Letting $$V_0 = \frac{2V_{thermal}(h-l)}{d}$$

leads to simplified Equation 2, which is an exemplary embodiment of an equation for modeling filament length growth in an RRAM cell. Equation 2 is:

[Eq. 2]

$$\frac{dl}{dt} = d\tau_0 \exp\left(\frac{-U_a}{V_{thermal}}\right) \left( \exp\left(\frac{V}{V_0}\right) - \exp\left(\frac{-V}{V_0}\right) \right) \quad (2)$$

$$= d\tau_0 \exp\left(\frac{-U_a}{V_{thermal}}\right) \left( \sinh\left(\frac{V}{V_0}\right) \right)$$

Figure 4:
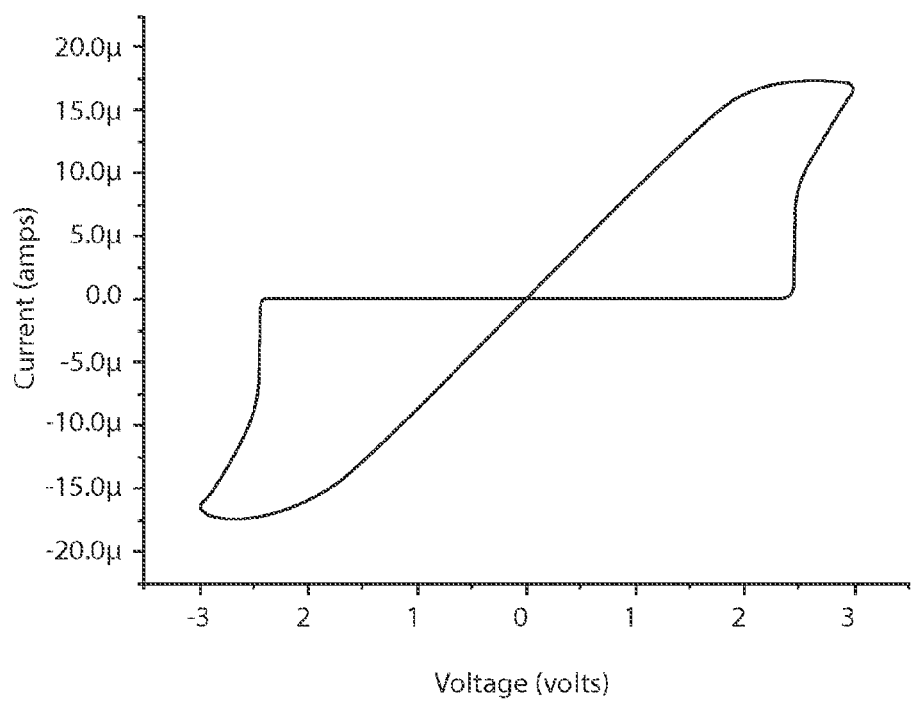
FIG. 4 illustrates hysteretic switching behavior of a two-terminal RRAM cell.

After the filament length l has reached a value such that the filament essentially touches the bottom electrode (e.g. char-acterized by the conductance being equal to the conductance quantum ($7.748 \times 10^{-5}$ S), or the spacing between the filament front 206 and the bottom electrode 208 being equal to the lattice spacing of the metal ion), vertical growth halts and the filament enters the second growth stage, characterized by the expansion of its width as shown in FIG. 4. The growth of the filament's diameter or width or area can be modeled as the addition of conductive filaments in parallel with the first. Thus, Equation 2 can be used when modeling the width growth as well. During width growth, the term h−l remains constant, so the second stage of growth is a simpler function of voltage.

During the first growth phase, the width variable remains equal to zero, and so the RRAM cell current is determined solely by the tunneling junction formed between the conductive filament 202 and the bottom electrode 208. Different models, including direct tunneling, trap-assisted tunneling, Frenkel-Poole conduction, and linear or non-linear resistor models, can be used to describe the current between the filament 202 and the bottom electrode 208. In an embodiment, the I-V can be calculated using a tunneling model according to the following Equation 3:

[Eq. 3]

$$I_{Tunneling} = \sin V \cdot Area \cdot J_0 \cdot (P_q \exp(-A\sqrt{P_q}) \exp(P_q + q|V|) \exp(-A\sqrt{P_q + q|V|})) \quad (3)$$

where $$J_0 = \frac{q}{2\pi h_0 s^2}$$

$$A = \frac{4\pi x \sqrt{2m}}{h_0}$$

$$s = h - l$$

and
$P_q$ is the average barrier height,
h is the distance between electrodes,
l is the length of the conductive filament,
q is the charge on an electron,
Area is the area of the end of a filament,
$h_0$ is Plank's constant, and
m is the mass of an electron.

Because tunneling current is exponentially dependent on barrier thickness, a dramatic increase in cell conductance occurs as the filament approaches the bottom electrode 208. It is during this phase that the cell is qualitatively said to have switched in a digital sense to the 'ON' state.

When a cell enters the width growth phase, further increases in current density are the result of areal expansion of the filament. The expansion can be described either in terms of increasing the number of filaments, or as increasing the cross-sectional area of a single filament. When the filament makes Ohmic contacts with the electrodes, the current is then determined as a function of width by Equation 4:

[Eq. 4]

$$I_{width} = V \cdot width \cdot G_0 \quad (4)$$

where the variable width represents a number of filaments, and $G_0$ is the conductance through a single filament, which is normally constant for a given material. The total current consists of the sum of the two conduction regimes (Equations 3 and 4), as shown in Equation 5:

[Eq. 5]

$$I = I_{Tunneling} + I_{Width} \quad (5)$$

In another case the current due to width growth can be described by Equation 6 which includes the Schottky term (1st term) and the tunneling term (2nd term):

[Eq. 6]

$$I_{width} = (1-w)\alpha[1-\exp(-\beta V)] + w\gamma \sin h(\delta V) \quad (6)$$

The two conduction channels are in parallel and their relative weight is determined by the internal state variable w, which is the normalized area index representing the conductive region, i.e. w=0 indicates fully Schottky-dominated conduction, while w=1 indicates fully tunneling-dominated conduction. α, β, γ, δ, η1, and η2 are all positive-valued parameters determined by material properties such as the barrier height for a Schottky barrier and for tunneling, the depletion width in the Schottky barrier region, the effective tunneling distance in the conducting region, and interface effects. In practice they can be treated as fitting parameters and are independent of w.

It is possible that the programming process can be dominated by either length growth or width growth; in that case, I will be dominated by $I_{Tunnel}$ or $I_{width}$ in Equation 5.

The following Equations 7 is useful for describing the width propagation phase of RRAM cell activity.

[Eq. 7]

$$\frac{dw}{dt} = \lambda[\exp(\eta_1 V) - \exp(-\eta_2 V)] \quad (7)$$

Equation 7 describes the rate of change of the state variable representing width with respect to the applied voltage. It originates from Equation 3 but is no longer explicitly dependent on the state variables/or w since the existing conductive regions do not affect the formation of new conductive regions. The expression is further chosen such that (dw/dt) can be different at positive and negative biases (η1≠η2) to account for potential differences in the activation energies for forward and backward ion hopping, e.g. in the presence of a build-in field. Having asymmetric activation energies (η1≠η2) however is not essential in modeling. When η1≠η2 Equation 7 becomes a simpler form of Sin h(ηV).

The growth and retraction of a conductive filament through a length growth and width growth phase leads to hysteretic behavior in an RRAM cell that can be accurately modeled using the above equations. Representative hysteretic behavior is shown by the I-V curve in FIG. 4.

As switching occurs, current passes through the device, and thus, power is dissipated within the body of the cell, thereby raising its temperature. Because both tunneling current and filament growth are positively correlated with device temperature, a positive feedback mechanism accelerates the growth of the filament and enhances current output.

Despite the rise in temperature and corresponding barrier height reduction, filament growth is halted when the electric field through the device diminishes. Nevertheless, temperature effects can play an important role in determining the final resistance value after switching. An embodiment in a SPICE environment allows for the incorporation of temperature effects through the 'temp_coeff' parameter, which serves as the heat capacity of the device in units K/W.

Figure 5A:
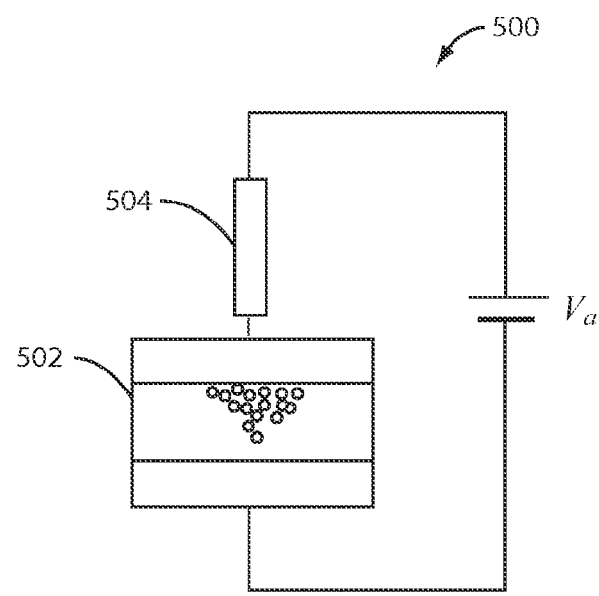
FIG. 5a illustrates a simple circuit according to an embodiment of the present invention.
Figure 5B:
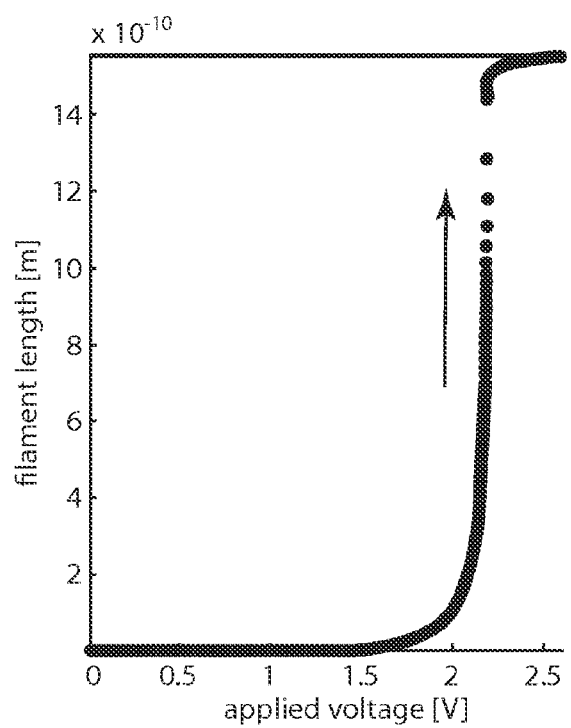
FIG. 5b illustrates filament length as a function of voltage where the line of large dots shows an increase in filament length as voltage increases to 2.5V, and the line of small dots shows the filament length as voltage decreases back to zero in a two-terminal RRAM cell.
Figure 5C:
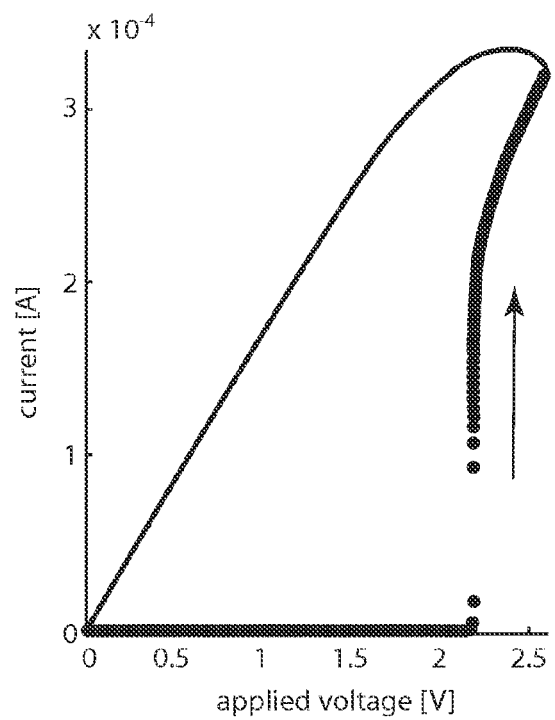
FIG. 5c illustrates current as a function of voltage in a voltage sweep where the line of large dots represents current as voltage increases to 2.5V, and the line of small dots shows the current as voltage decreases back to zero in a two-terminal RRAM cell.
Figure 5D:
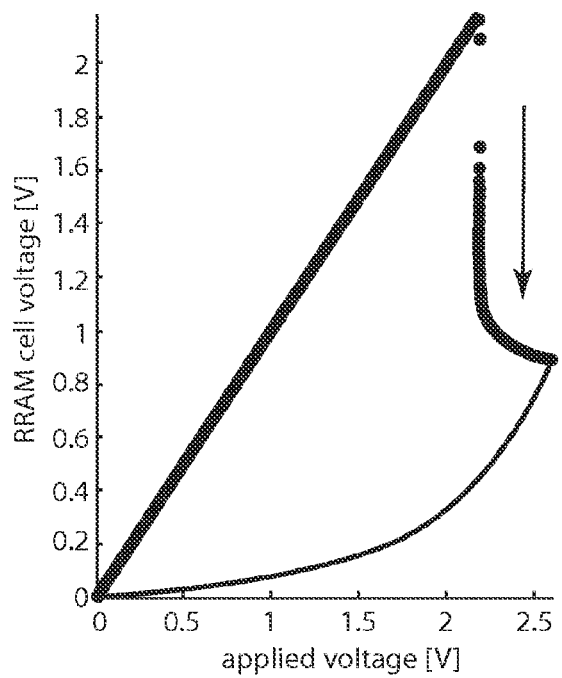
FIG. 5d illustrates voltage as a function of applied voltage in a voltage sweep where the line of large dots represents voltage as the applied voltage increases to 2.5V, and the line of small dots shows voltage as the applied voltage decreases back to zero in a two-terminal RRAM cell.

FIG. 5a shows a circuit 500 used in a simulation program, including a RRAM device 502 connected in series with a resistor 504 and voltage source $V_a$. In various embodiments, resistor 502 can be replaced with current-compliance, a diode, or a transistor. FIGS. 5b to 5d show the effects of a voltage sweep performed on RRAM device 502 in circuit 500.

Figure 5E:
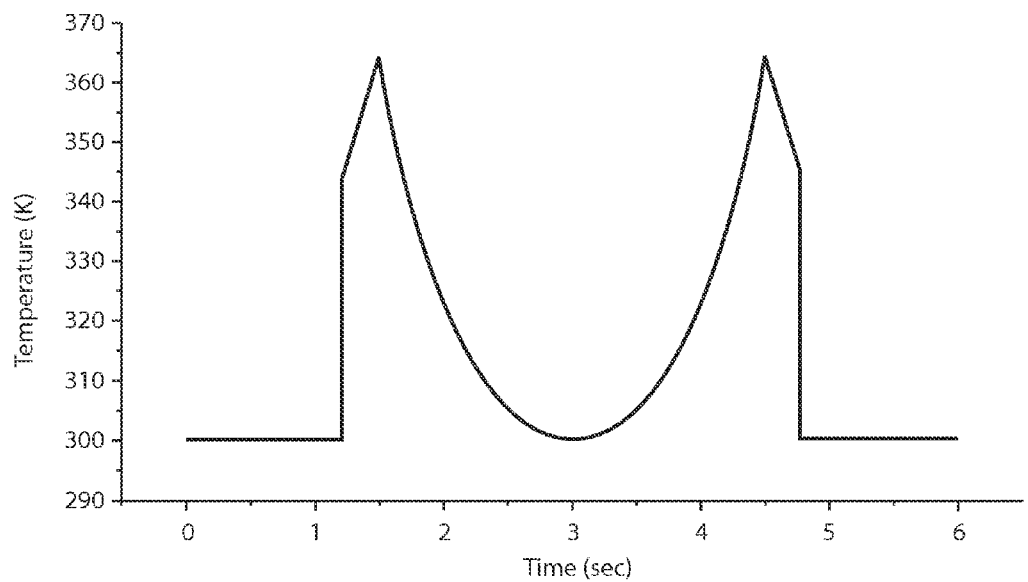
FIG. 5e illustrates the temperature of a two-terminal RRAM cell with respect to time when a voltage is applied according to FIG. 5f.
Figure 5F:
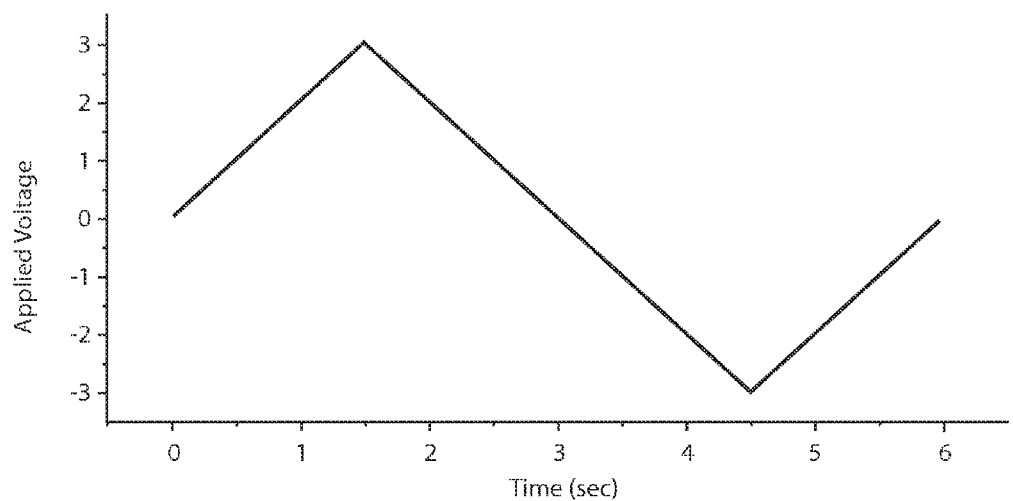
FIG. 5f illustrates a voltage curve applied to a two-terminal RRAM cell.

As a filament grows with applied voltage, as shown in FIG. 5b, the current through the device sharply increases due to the non-linear effects described in Equations 2 and 3 as shown in FIG. 5c. In the meantime, a voltage divider effect between the device and the series resistor reduces the voltage applied across the cell, as shown in FIG. 5d. The reduced electric field within the device in turn retards further filament growth. FIG. 5e shows a temperature profile over time in a cell according to the applied voltage over time shown in FIG. 5f.

Various embodiments can incorporate various physics models in a simulation within the scope and spirit of the invention. In an exemplary embodiment, SPICE code using Equation 2 and Equation 5 for an RRAM component was constructed, and is featured in Table 1 below. Because most SPICE simulation environments cannot handle equations such as Eq. 3 directly and do not allow for arbitrary internal mutable variables, floating node capacitors are used to store the state variables required by the model. Thus, voltage or other electrical properties act as a proxy for physical state variables. In some embodiments, by using the SPICE '.ic' directive, initial conditions can be imposed on the state variables. This allows the user to begin a simulation with cells in the 'ON,' or even intermediate states.

TABLE 1

SPICE code listing for a two-terminal RRAM device

```
*Parameters:
*to is hopping attempt frequency
*area is device area
*d is site hopping distance
*w is device length
*Ua is ion barrier height
*P is electron barrier height
.subckt memristor 3 1 params:
+ to=4e12 area=1e-16 d=1-9 Ua=0.87 w=2.29e-9 P=.31 Rfil=100
*Notes:
*************************************************************
*In any function where k is a parameter, k is simply a dummy
variable, always called with 0 and not
*used in the function. A function was simply used for clarity.
*************************************************************
.param k=1.38e-23 ;Boltzman's Constant
.param echarge=1.6021e-19 ;Charge on electron
.param temp_coeff=3e5 ;Specific Heat of Silver
.param th_conduct=0 ;
.param plank = {6.62606e-34} ;Plank's Constant
.param Pq={P*echarge} ;Electron Barrier Height
.param m={0.09*9.109e-31} ;effective mass of an electron
.param lamda=0.03 a1=2.1 a2=2.3
.param nnor=1e-9
.param cpac={1}
.func T(z) 300 + temp_coeff*V(1,3)*I(Rmet)
.func Vthermal(z) {k*T(0)/echarge}
Rmet 1 2 {Rfil}
*Current Output:
.func A(z) {4*Pi*(w-cpac*V(length))*sqrt(2*m)/plank}
.func Jo(z) {echarge/(2*Pi*plank*(w-cpac*V(length))**2)}
.func J_tun(z) {sgn(V(2,3))*area*Jo(0)*(Pq*exp(-(0)*sqrt(Pq))-
(Pq+echarge*abs(V(2,3)))*exp(-A(0)*sqrt
(Pq+echarge*abs(V(2,3)))))}
Bw 2 3 I=J_tun (0) + V(2,3)*(V(width))*(77e-6)
*State variables:
Clength length 0 1
Cwidth width 0 1
Ctemp temp 0 1
```

TABLE 1-continued

SPICE code listing for a two-terminal RRAM device

```
*Initial Conditions:
.ic V(length) = .1e-12
.ic V(width) = 0
.ic V(temp) = 300
*Supplementary Functions:
.func Vo(z) 2*Vthermal(0)*(w-cpac*V(length))/d
.func ion_flow(z) { d*to*exp(-
Ua/Vthermal(0))*(exp(V(2,3)/Vo(0))-exp(-V(2,3)/Vo(0))) }
.func prev_underfloor(z) {u( sgn(cpac*V(length)-1e-12) +
sgn(ion_flow(0)) + 1 ) }
.func single_growth(z) {u(77e-6 - J_tun(0)/V(2,3))*(V(2,3)>=0)
+ (V(2,3)<0)*(V(width)<=0)}
*State Variable Derivatives:
Blength 0 length I=single_growth(0)*prev_underflow(0)
*ion_flow(0)
Bwidth 0 width I=(1-single_growth(0))*ion_flow(0)/V(length)
Btemp 0 temp I=temp_coeff*V(1,3)*I(Rmet)
.ends memristor
```

Figure 6A:
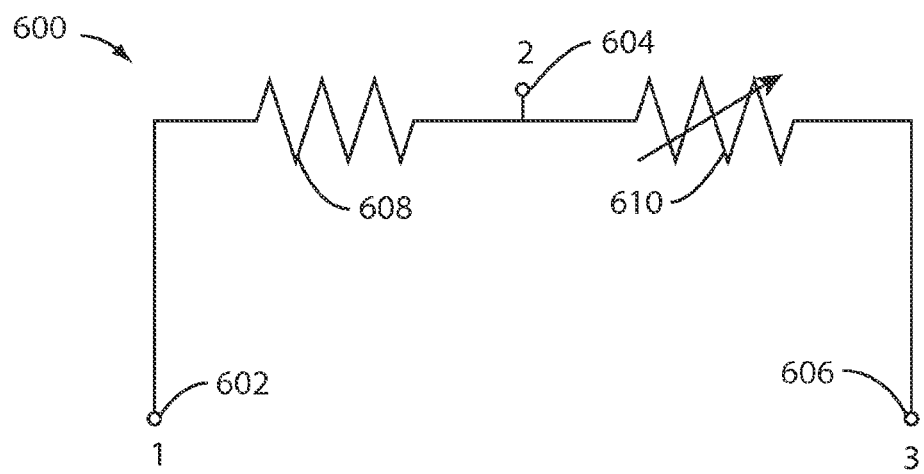
FIG. 6a illustrates the layout of a sub-circuit corresponding to an RRAM cell.
Figure 6B:
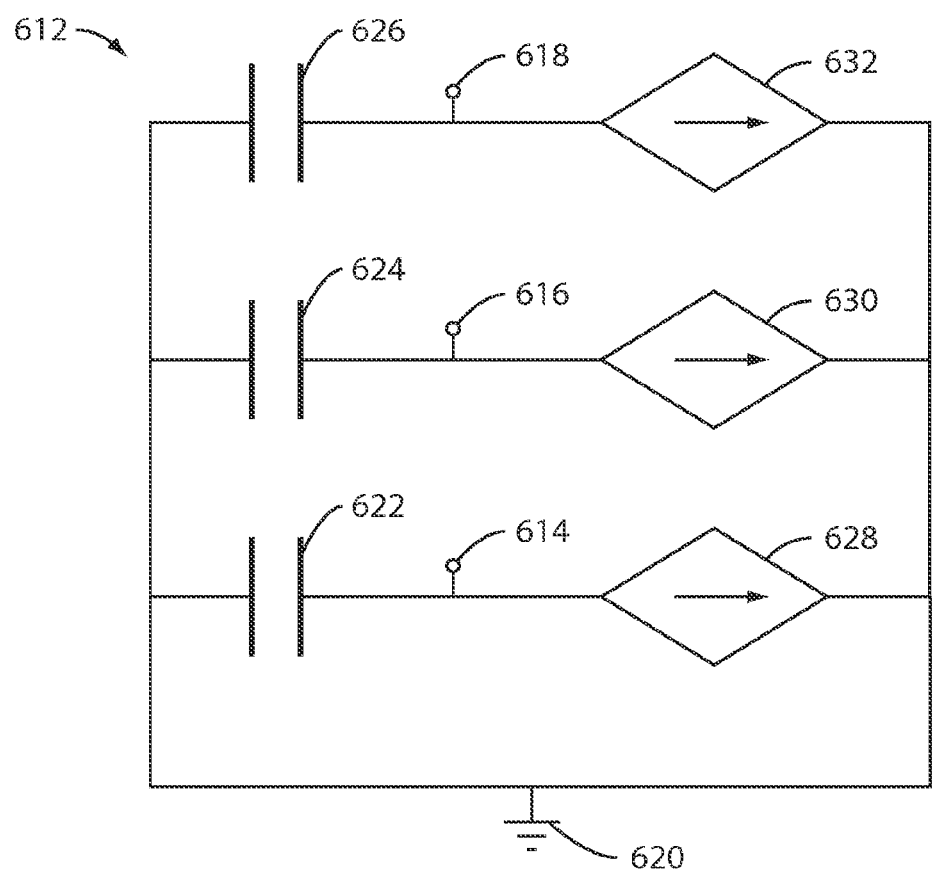
FIG. 6b illustrates the layout of a sub-circuit using components to hold state variables representing RRAM behavior.

FIGS. 6a and 6b illustrate the layout of sub-circuits corresponding to the code in Table 1. The code can be thought of as having two parts. The first part is described by earlier sections of code including parameter definitions and functions through the line "*State variables." This portion of the code corresponds to the circuit illustrated in FIG. 6a. The circuit has three node locations 602, 604, and 606, corresponding to node 1, node 2, and node 3, respectively.

The sub-circuit 600 in FIG. 6a correlates to an actual RRAM cell, such as the cell represented in FIG. 2. Conceptually, node location 602 in FIG. 6a corresponds to top electrode 204, node location 604 corresponds to the filament front 206, and node 606 corresponds to bottom electrode 208. Resistor 608, located between node 602 and node 604, corresponds to the "Rmet" resistor in the Table 1 code, which represents the fixed parasitic resistance inside an RRAM cell. Variable resistor 610 represents the active region, or switching region, of an RRAM cell. Current is solved for this region of a cell using the "Bw" function in Table 1, which corresponds to Equation 5, and is a function of $V_{length}$, $V_{width}$, input voltage, and temperature.

Portions of the code in Table 1 beginning with the term "*State variables" and extending to the end of Table 1 correspond to the sub-circuit 612 shown in FIG. 6b. Sub-circuit 612 comprises three nodes 614, 616, and 618, corresponding to nodes "length," "width," and "temp" in Table 1, respectively. A fourth node 620, node 0, is located at ground. Similarly, the circuit has three capacitors 622, 624, and 626, and three current sources 628, 630, and 632, one for each of the state variables representing length, width, and temperature. The capacitors are represented by Clength, Cnum, and Ctemp in Table 1, while the current sources are represented by Blength, Bwidth, and Btemp. In this embodiment, SPICE treats the internal state variables representing physical characteristics as voltages.

Although the code in Table 1 shows a capacitor Ctemp, it is not necessary to have a capacitor for temperature in order to run a simulation using the Table in some embodiments. The simulation can be performed using components other than capacitors to perform derivative functions. In other embodiments, the components may include a current or voltage source, inductor, resistor, transistor, diode, or a combination thereof. In the embodiment in Table 1, the voltages on the floating nodes control the filament (e.g. length and width) growth while the voltage dropped across the device controls the current output and temperature characteristics. Growth of length and width is accelerated by elevated temperatures.

Because the filament growth is exponentially dependent on the applied electric field, reducing the voltage across the device has a large impact on the derivative of the conductance. Using a series resistor, the filament growth can be controllably stopped at a specific conductance determined by the series-resistor, a consequence of which is the ability to reliably store more than two values of data in a cell.

In an embodiment according to circuit 500 in FIG. 5, when the RRAM device 502 is in the 'OFF,' or high resistance state, nearly all of the voltage is dropped across the cell. As the filament grows, however, the resistance of the cell drops and a voltage divider is formed effect between the resistor 504 and the RRAM device 502 due to the series configuration. This has the effect of reducing the electric field within the solid electrolyte, which corresponds to much slower filament growth. The negative feedback provided by the voltage divider dampens growth exponentially with further increases in cell conductance until the voltage drop across the cells drops to the point that growth is imperceptible and the cell settles at a final resistance. This happens very quickly during the filament formation process.

Figure 7A:
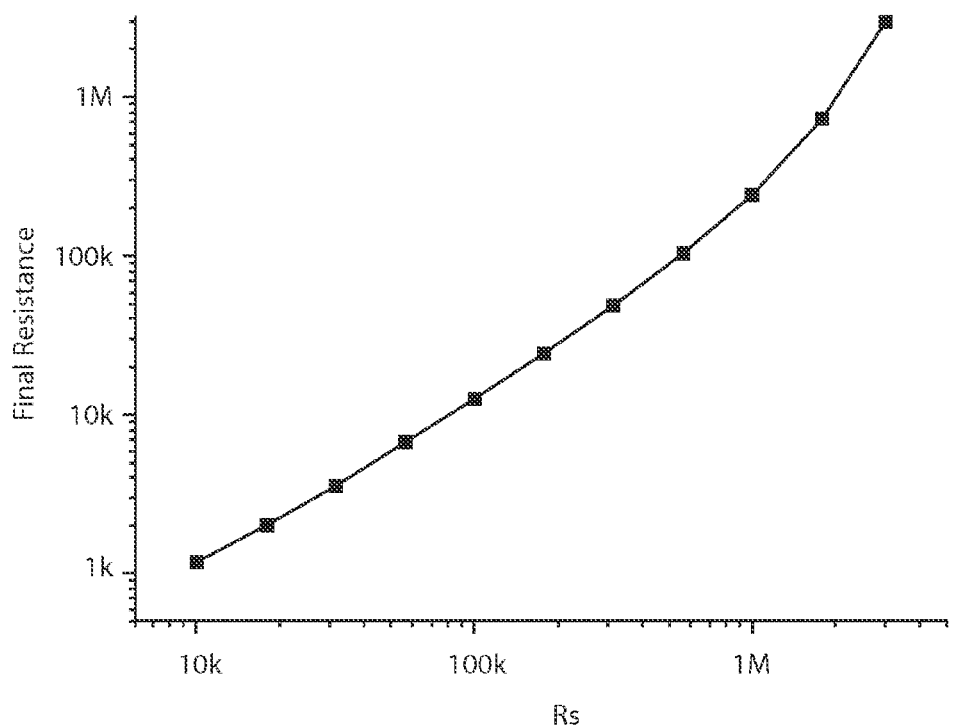
FIG. 7a illustrates a final resistance of a two-terminal RRAM cell after applying 4.75V for 50 nanoseconds through a variable resistor Rs.

FIG. 7a shows how the final resistance state is controlled by the use of resistors of various values. Thus, by controlling the series resistance using, for example, a series of resistors, a diode, a MOS selector, or different current compliance, multilevel resistance values can be achieved. This enables more than two values of data to be stored in each RRAM cell, thereby increasing data density with minimal increase in device footprint for controlling resistance. FIG. 7a shows the final resistance state after applying 4.75V for 50 nanoseconds through a variable resistor at various resistor values.

Figure 7B:
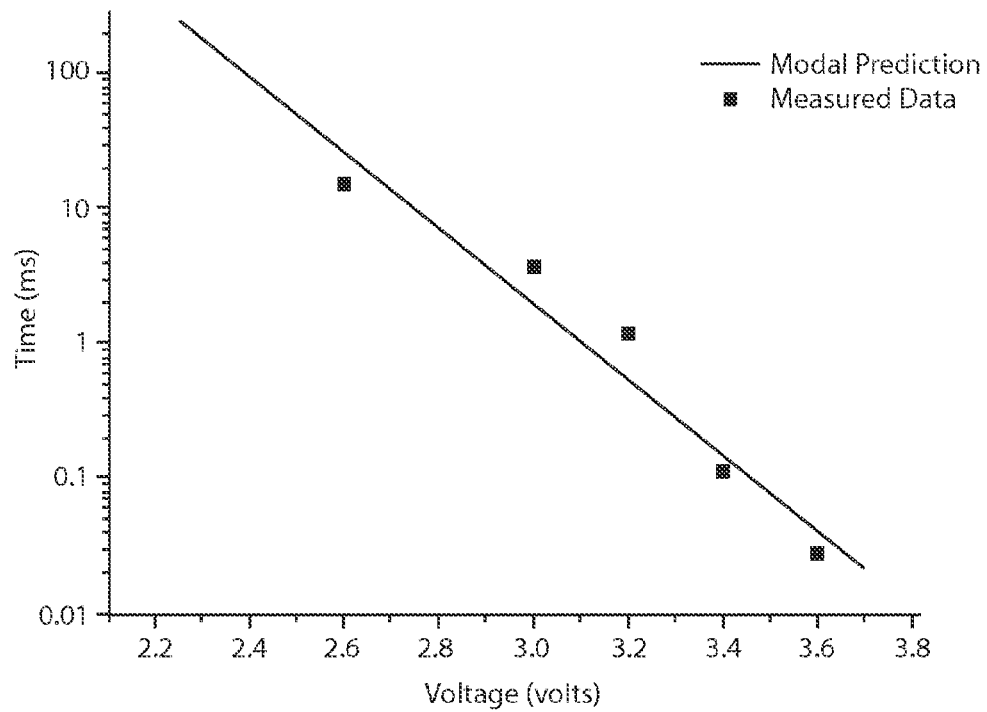
FIG. 7b illustrates switching time of a two-terminal RRAM cell with respect to voltage.

Because of the rapidity with which the device can change state, the RRAM simulation provided herein is particularly useful for capturing switching dynamics which may be hard to obtain using other, simpler simulations. In particular, the switching speed is not a constant for a given RRAM device, but rather is a sensitive function of the applied bias. For example, by examining Equation 2, we see that the switching delay, τ, is an exponential function of the voltage applied across the device. FIG. 7b shows the results of a model prediction, represented as a line, plotted against actual measured data, which is plotted as individual data points. FIG. 7b demonstrates that the SPICE model's predicted switching times fit the switching times reported experimentally. The SPICE simulation of this embodiment shows that τ is not dependent on the series resistance value.

The results output by the SPICE-based embodiment described above are consistent with the notion that the ion migration in two-terminal RRAM devices depends on the applied electric field. When an RRAM cell is in the 'OFF' state, its resistance is orders of magnitude larger than any series resistor normally used in the circuit, so nearly all of the voltage is dropped across the device, causing it to switch.

Figure 8:
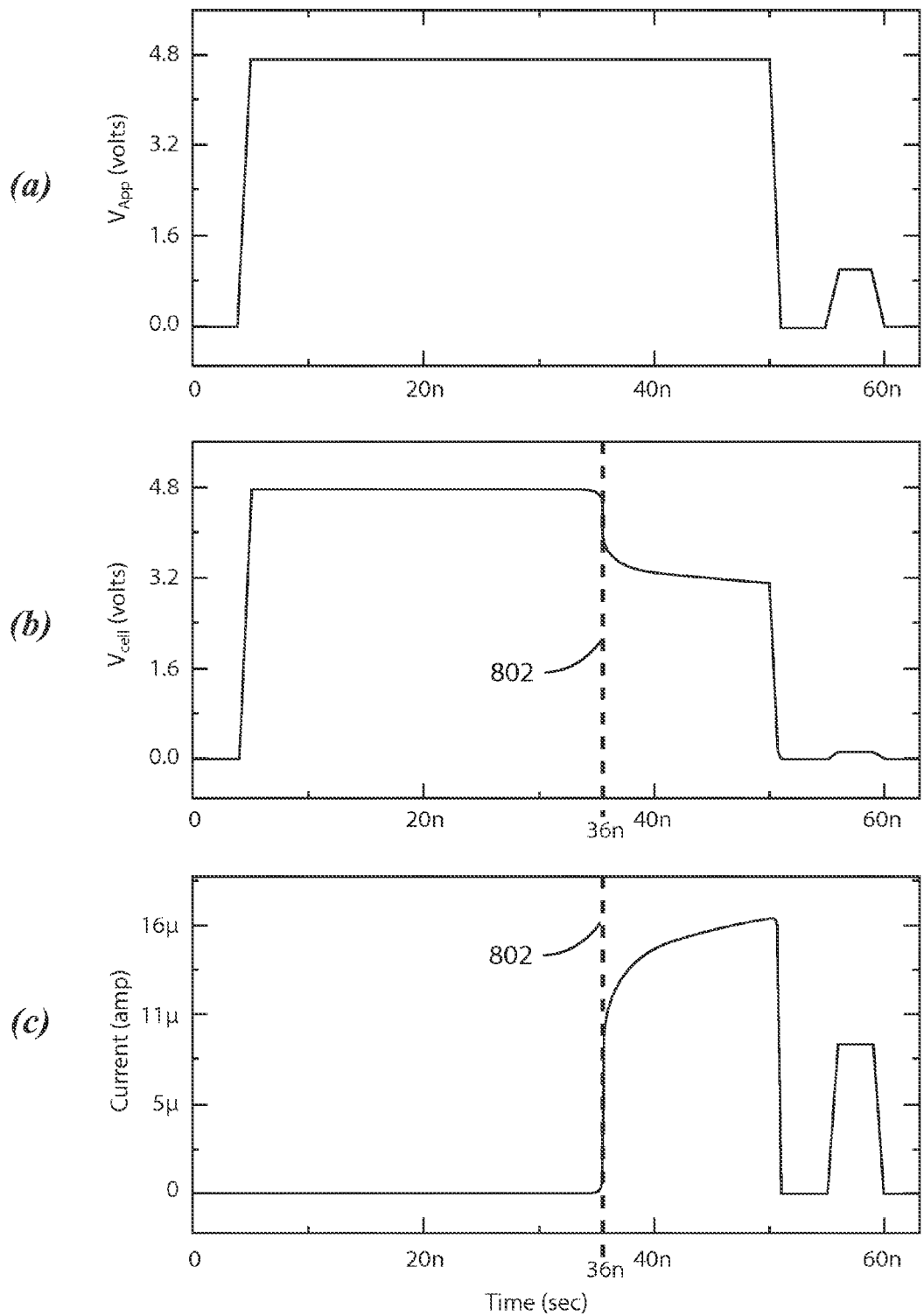
FIG. 8a illustrates a voltage curve with respect to time applied to a two-terminal RRAM cell and a series resistor, with a programming pulse followed by a read pulse.
FIGS. 8b and 8c illustrate current and voltage with respect to time in a two-terminal RRAM cell when the voltage pulses in FIG. 8a are applied, with a switching event at 36 nanoseconds and $V_{cell}$ is the RRAM cell voltage.

FIG. 8 shows a typical write-read sequence in an RRAM cell using programming and read pulses. The switching event 802, represented by a dotted line, is defined qualitatively as a substantial rise in current with a corresponding reduction in the voltage dropped across the device. The switching event 802 occurs at 36 ns. After programming, the device is probed using a voltage pulse with a magnitude much smaller (1 volt in this case) than that used for programming. Using the current through the circuit and the voltage dropped across the RRAM cell, a final resistance value can be calculated at a given read voltage.

Following this write-read procedure, the final cell resistance values were found while varying the external series resistor 504. The final resistance state varies linearly for series resistance values below 1M, with superlinear dependence above. The nonlinear dependence beyond 1M can be attributed to the elongation of a switching event, such that the device will not have fully switched when a very high series resistance is used.

Figure 9:
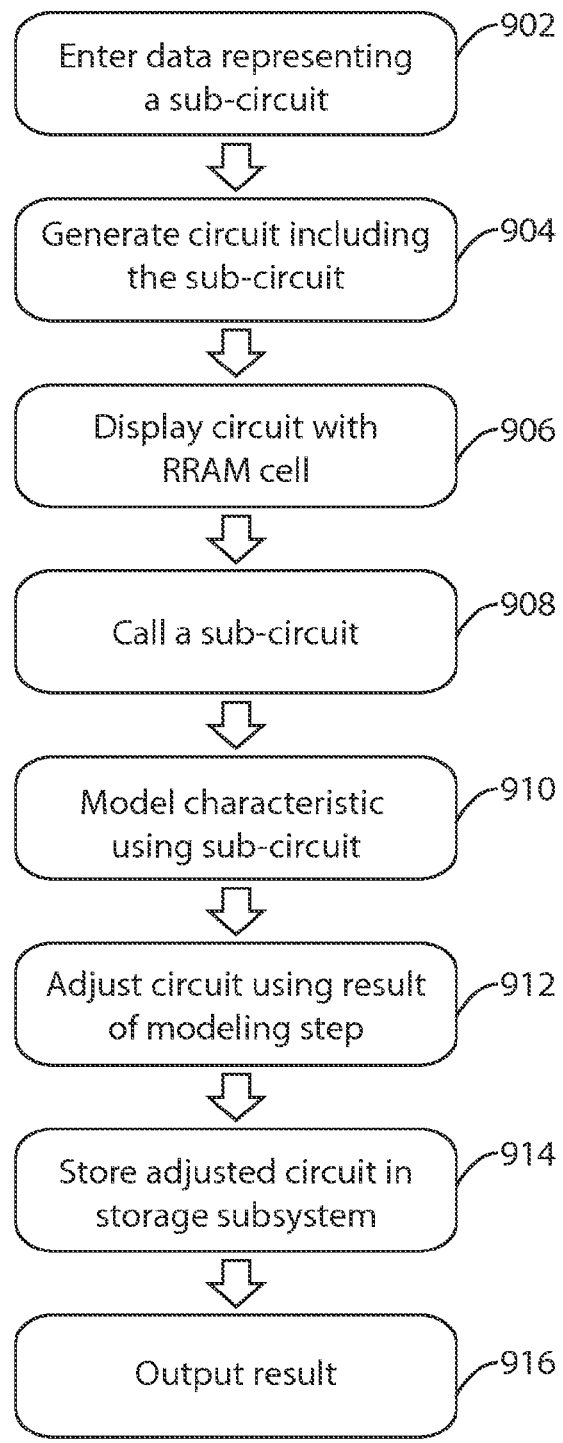
FIG. 9 illustrates a flowchart of a method for simulating an RRAM cell according to an embodiment of the present invention.

A method for implementing an RRAM simulation according to an embodiment will be now described with respect to FIG. 9. Although the embodiment is described as a simulation run in a SPICE environment, similar methods can be used in other simulation environments without departing from the scope and spirit of the invention.

A simulation can be conducted in SPICE software, or other electronic simulation software that accepts programmable data to model the performance of components. A user enters data in step 902, which includes data representing the electrical behavior of an RRAM cell. To accurately model two-terminal RRAM, the data should include at least an equation representing filament length growth. In an exemplary embodiment, the length growth equation is represented by Equation 2. Various embodiments can include various equations representing RRAM cell behavior, depending on the nature of the simulation and the desired level of accuracy. A highly accurate simulation can be made using Equation 2 to represent a length growth characteristic, Equation 7 to represent width growth, Equation 3 for tunneling current, equation 4 for areal expansion current, and a function such as the "temp_coeff" function in SPICE to represent thermal characteristics. An example of user data configured for SPICE is found in Table 1 above.

The data entry step 902 may include data that assigns equations to represent electrical components to build a sub-circuit. The specific components may be selected according to a component's ability to accept the equations, such as the derivative with respect to time in Equation 3. For example, the data in Table 1 uses floating capacitor nodes to store internal state variables. In other embodiments, components including a current source, voltage source, capacitor, inductor, resistor, transistor, or diode, or a combination of these components or their equivalents, can be used to store state variables.

The data may include initial conditions of variables in the simulated RRAM module, including conditions of filament length, filament width, and device temperature. In the embodiment shown in Table 1, initial conditions are specified using the ".ic" function in SPICE. Specifying initial conditions can be helpful for simulating various resistance states of a RRAM cell, or for specifying whether a cell is initially configured to be in an 'ON' or 'OFF' condition.

The data is written to a memory as it is entered. In an embodiment, the memory is located in the storage subsystem 114 shown in FIG. 1, and can be in either the memory subsystem 116 or the file storage subsystem 122. In some embodiments the memory can be portable, or stored remotely and accessed via a network. The memory should be non-transient, and accessible by a system that is configured to perform a simulation. In the embodiment shown by Table 1, the data is entered so that the final data set represents a sub-circuit, which according to FIG. 6 comprises sub-circuits 600 and 612.

In step 904, data is entered representing an electrical circuit including the sub-circuit from step 902. The circuit can be simple as circuit 500, or highly complex, involving a large number of memory cells. Circuits can be designed for many purposes including to simulate an actual product, to test a design principle, and to test the accuracy of a theory. One of skill in the art will recognize that there are virtually unlimited permutations of circuits that can be created to simulate various devices, properties, and conditions.

In some embodiments, step 902 is performed well in advance of subsequent simulation steps. Step 902 can be performed once for a plurality of subsequent simulations. For instance, SPICE can accept a simulated circuit in the form of a netlist. A single netlist can be prepared according to the above described methods and written to a memory, then recalled by the same or other users at later points in time to perform simulations. In other embodiments, steps 902 can be performed contemporaneously with circuit generation 904.

After a simulated circuit is generated, a user can conduct a simulation using the simulated circuit to solve for various properties or conditions including current, voltage, resistance, temperature, filament length, or filament width at various points in time. In step 906, a circuit including at least one RRAM cell is provided to the user in a display area of a computer system 100 so that the user can access data representing the circuit. Next, in step 908, the computer system calls the sub-circuit created in step 902 as a part of the circuit representing an RRAM cell. The circuit is then modeled using the computer system in step 910. In an embodiment, the modeling step includes performing a set of calculations using a processor 102 to model electrical and physical characteristics of the circuit. Next, in step 912, the circuit is adjusted using a result of the modeling step. The adjustment may be made as a result of changed conditions within the circuit including electrical, thermal, and physical properties, over time. The adjusted circuit is then stored in a storage subsystem 114 of computer system 100.

In step 916, the system outputs the desired result to an output device 112 as shown in FIG. 1, and/or stores the output on a memory in the memory subsystem 116 or the file storage subsystem 122. Some of the outputs in the form of voltage may actually represent physical properties of the simulated RRAM cell, including temperature, area, and length. Thus, in some embodiments, an additional step of converting values may be required, or performed as part of the modeling.

The embodiment presented herein provides an accurate, physical model of an RRAM cell that can be used to simulate these novel devices and their interaction with other elements in a circuit. An emphasis was placed on describing the transient dynamics of the device so that its behavior during the switching event is captured. The important current characteristics are categorized into two phases corresponding to filament growth in length and width.

The present invention has been described using selected embodiments. However, the invention may be modified without departing from the scope and spirit thereof. For example, the modeling techniques can be applied to represent various types of RRAM devices including those based on metal oxide, chalcogenide based, and organic materials.

Similarly, the modeling techniques described herein may be used with circuit simulation software programs other than SPICE, on a dedicated apparatus, or through any other means for simulating or predicting RRAM behavior.

What is claimed is:

1. A computer-implemented method for modeling a circuit including a resistive random access memory (RRAM) cell in a computer system programmed to perform the method, the method comprising:

implementing in the computer system, a circuit simulation environment;

displaying on a display of the computer system within the circuit simulation environment, a circuit including at least one RRAM cell, the RRAM cell being associated with a first internal state variable;

retrieving from a memory of the computer system within the circuit simulation environment, a sub-circuit module compatible with the circuit simulation environment, that represents behavior of the RRAM cell comprising a first component that corresponds to a formula for determining the first internal state variable;

determining in the computer system within the circuit simulation environment, a characteristic of the RRAM cell within the circuit in response to the sub-circuit module compatible with the circuit simulation environment by solving the formula for the first internal state variable and obtaining a value representing the characteristic of the RRAM cell;

updating the display of the computer system to include at least the value representing the characteristic of the RRAM cell;

receiving in the computer system within the circuit simulation environment, modifications to the circuit to form an adjusted circuit in response to the characteristic of the circuit; and storing in the memory of the computer system, the adjusted circuit.

2. The method of claim 1, wherein the first internal state variable is represented by a simulated electrical component within the computer system.

3. The method of claim 2, wherein the simulated electrical component is selected from a group consisting of: a current source, voltage source, capacitor, inductor, resistor, transistor, and diode.

4. The method of claim 1, wherein the formula includes a formula representing dynamic length growth of a filament in the RRAM.

5. The method of claim 4, wherein the formula further includes a formula representing dynamic width growth of the filament in the RRAM.

6. The method of claim 5, wherein the formula representing the dynamic width growth is modeled by simulating a plurality of filaments.

7. The method of claim 5, wherein the formula representing dynamic width growth is modeled by varying a lateral dimension of the filament.

8. The method of claim 5, wherein the formula representing the dynamic width growth of the filament: dw/dt is represented by the equation:

$$\frac{dw}{dt} = \lambda [\exp(\eta_1 V) - \exp(-\eta_2 V)],$$

wherein $\lambda$ wherein $\eta_1$ is an activation energy under a positive bias, wherein $\eta_2$ is an activation energy under a negative bias, wherein V is an applied voltage.

9. The method of claim 4, wherein the formula representing the dynamic length growth of the filament: dl/dt is represented by the equation:

$$d\tau_0 \exp\left(\frac{-U_a}{V_{thermal}}\right)\left(\sinh\left(\frac{V}{V_0}\right)\right)$$

wherein d is distance between impurities, wherein $\tau_0$ is an ion hop attempt frequency, wherein $U_a$ is activation energy, wherein $V_{thermal} = kT/q$, wherein k is Boltzmann's constant in Joules/Kelvin, wherein T is temperature in Kelvin, wherein q is charge on an electron, wherein V is an applied voltage, wherein $V_0 = 2V_{thermal}(h-1)/d$, wherein h is distance between electrodes, and wherein l is filament length.

10. The method of claim 1, wherein the behavior of the RRAM is selected from a group consisting of: hysteretic growth behavior, separate length growth and width growth phases.

11. The method of claim 1, wherein the formula for determining the first internal state variable includes a temperature characteristic.

12. The method of claim 1, wherein the behavior of the RRAM cell is characterized by a resistance state from a set of three or more possible resistance states for the RRAM cell.

13. The method of claim 1, wherein the RRAM cell is associated with a second internal state variable;

wherein the first internal variable is associated with a length growth of a filament of the RRAM; and wherein the second internal variable is associated with a width growth of the filament of the RRAM.

14. The method of claim 1, wherein the circuit simulation environment comprises a Simulation Program with Integrated Circuit Emphasis (SPICE) environment.

* * * * *